(12) United States Patent
Bai et al.

(10) Patent No.: US 11,707,840 B1
(45) Date of Patent: Jul. 25, 2023

(54) MITIGATING REALITY GAP THROUGH OPTIMIZATION OF SIMULATED HARDWARE PARAMETER(S) OF SIMULATED ROBOT

(71) Applicant: X Development LLC, Mountain View, CA (US)

(72) Inventors: Yunfei Bai, Fremont, CA (US); Elmar Mair, Santa Cruz, CA (US); Yuchen Wu, San Francisco, CA (US); Ian Wilkes, Palo Alto, CA (US); Max Moroz, Palo Alto, CA (US); Weidan Wu, Palo Alto, CA (US)

(73) Assignee: GOOGLE LLC, Mountain View, CA (US)

( * ) Notice: Subject to any disclaimer, the term of this patent is extended or adjusted under 35 U.S.C. 154(b) by 42 days.

(21) Appl. No.: 17/535,373

(22) Filed: Nov. 24, 2021

Related U.S. Application Data

(63) Continuation of application No. 16/234,289, filed on Dec. 27, 2018, now Pat. No. 11,213,946.

(51) Int. Cl.
  *G06F 17/00* (2019.01)
  *B25J 9/16* (2006.01)
  (Continued)

(52) U.S. Cl.
  CPC ............. *B25J 9/163* (2013.01); *B25J 9/1653* (2013.01); *G05B 13/0265* (2013.01); *G05B 13/042* (2013.01)

(58) Field of Classification Search
  CPC . B25J 9/163; B25J 19/00; B25J 9/1687; B25J 5/00; B25J 9/1612; B25J 9/1664; B25J 9/0093; B25J 9/1694; B25J 9/162; B25J 9/1697; B25J 19/021; B25J 9/1671; G06T 7/55; G06T 19/003; G06T 7/593; G06T 7/13; G06T 7/60; G06T 17/00; G06T 2200/04; G06K 9/00664; G06K 9/3208; G06K 9/6202; G06K 9/4604; G06K 9/52;
  (Continued)

(56) References Cited

U.S. PATENT DOCUMENTS 9,676,097 B1    6/2017  Gallagher
9,928,487 B2 *  3/2018  Kuffner, Jr. ............ G08B 21/18
(Continued)

*Primary Examiner* — Ronnie M Mancho
(74) *Attorney, Agent, or Firm* — Gray Ice Higdon

(57) ABSTRACT

Mitigating the reality gap through optimization of one or more simulated hardware parameters for simulated hardware components of a simulated robot. Implementations generate and store real navigation data instances that are each based on a corresponding episode of locomotion of a real robot. A real navigation data instance can include a sequence of velocity control instances generated to control a real robot during a real episode of locomotion of the real robot, and one or more ground truth values, where each of the ground truth values is a measured value of a corresponding property of the real robot (e.g., pose). The velocity control instances can be applied to a simulated robot, and one or more losses can be generated based on comparing the ground truth value(s) to corresponding simulated value(s) generated from applying the velocity control instances to the simulated robot. The simulated hardware parameters and environmental parameters can be optimized based on the loss(es).

18 Claims, 5 Drawing Sheets

(51) Int. Cl.
*G05B 13/02* (2006.01)
*G05B 13/04* (2006.01)

(58) Field of Classification Search
CPC .. G06K 9/00201; B65G 41/008; B65G 47/46; B65G 47/50; B65G 61/00; G01B 11/254; H04N 5/33; H04N 2013/0081; G05B 2219/39391; G05B 2219/31312; G05B 2219/40053; G05B 2219/40298; Y10S 901/06; Y10S 901/01; Y10S 901/47; B65H 67/065

USPC .......................................................... 700/264
See application file for complete search history.

(56) References Cited

U.S. PATENT DOCUMENTS

| | | | |
|---|---|---|---|
| 10,019,566 B1 * | 7/2018 | Gallagher | B25J 9/1666 |
| 10,166,676 B1 * | 1/2019 | Hudson | B25J 9/1612 |
| 10,189,159 B1 * | 1/2019 | Wilson | B25J 9/1653 |
| 10,207,404 B2 * | 2/2019 | Khansari Zadeh | B25J 9/1664 |
| 10,245,726 B1 * | 4/2019 | Jain | G05B 19/41865 |
| 10,245,731 B2 * | 4/2019 | Linnell | B25J 9/1697 |
| 10,279,480 B1 * | 5/2019 | Holson | G01C 9/00 |
| 10,303,180 B1 * | 5/2019 | Prats | G05D 1/0212 |
| 10,406,685 B1 * | 9/2019 | Wilson | B25J 15/08 |
| 10,427,306 B1 * | 10/2019 | Quinlan | B25J 11/008 |
| 10,552,803 B2 * | 2/2020 | Kuffner, Jr. | G06Q 10/20 |
| 10,562,181 B2 * | 2/2020 | Hudson | B25J 9/161 |
| 10,792,809 B2 * | 10/2020 | Bingham | B25J 19/023 |
| 10,945,641 B2 * | 3/2021 | Mirelman | A61B 5/369 |
| 11,010,127 B2 | 5/2021 | Orr et al. | |
| 11,213,946 B1 * | 1/2022 | Bai | G06N 20/00 |
| 2009/0240366 A1 * | 9/2009 | Kaushal | G06N 20/00 |
| | | | 700/110 |

* cited by examiner

MITIGATING REALITY GAP THROUGH OPTIMIZATION OF SIMULATED HARDWARE PARAMETER(S) OF SIMULATED ROBOT

BACKGROUND

Various machine learning based approaches to robotic control have been proposed. Some of those approaches train a machine learning model (e.g., a deep neural network model) that can be utilized to generate one or more predictions that are utilized in control of a robot, and train the machine learning model using training data that is based only on data from real-world physical robots. However, these and/or other approaches can have one or more drawbacks. For example, generating training data based on data from real-world physical robots requires heavy usage of one or more physical robots in generating data for the training data. This can be time-consuming (e.g., actually navigating a large quantity of paths requires a large quantity of time), can consume a large amount of resources (e.g., power required to operate the robots), can cause wear and tear to the robots being utilized, and/or can require a great deal of human intervention.

In view of these and/or other considerations, use of robotic simulators has been proposed to generate simulated robot data that can be utilized in generating simulated training data that can be utilized in training of the machine learning models. However, there is often a meaningful "reality gap" that exists between real robots and real environments—and the simulated robots and/or simulated environments simulated by a robotic simulator. This can result in generation of simulated training data that do not accurately reflect what would occur in a real environment. This can affect performance of machine learning models trained on such simulated training data and/or can require a significant amount of real world training data to also be utilized in training to help mitigate the reality gap.

SUMMARY

Implementations disclosed herein relate to mitigating the reality gap through optimization of one or more simulated hardware parameters for one or more simulated hardware components of a simulated robot. The one or more simulated hardware parameters can include, for example, simulated wheel spinning friction of a wheel of the simulated robot, simulated wheel rolling friction of the wheel of the simulated robot, simulated wheel lateral friction of the wheel of the simulated robot, simulated wheel diameter of the simulated robot, simulated controller gain of a motor of the simulated robot, simulated base spinning friction of a base of the simulated robot, simulated base rolling friction of the base of the simulated robot, and/or simulated base lateral friction of the base of the simulated robot.

In optimizing the simulated hardware parameter(s), implementations generate and store real navigation data instances that are each based on a corresponding episode of locomotion of a real robot. A real navigation data instance can include a sequence of velocity control instances generated to control a real robot during a real episode of locomotion of the real robot. Each velocity control instance can be the velocity control command(s) issued to actuator(s) of the robot at a corresponding instance, to control movement of the robot. Using the velocity control instances, instead of higher level control commands, enables the velocity control instances to be utilized in simulation to remove any reality gap impacts that may be present in simulated controllers that would translate the higher level control commands to the velocity control instance.

A real navigation data instance can also include one or more ground truth values, where each of the ground truth values is a measured value of a corresponding property of the real robot at a corresponding point of the real episode of locomotion. For example, the ground truth values for a navigation data instance can be poses (of the real robot) for a plurality of points of the real episode, velocities (of the real robot) for a plurality of points of the real episode, and/or other measured value. For instance, poses can be utilized and can be generated using a motion capture system, localizations from the real robot, and/or human measurements (e.g., using a tape measure and compass).

The real navigation data instances are then utilized in performing simulated episodes of locomotion using a robotic simulator that simulates a simulated robot and a simulated environment. During a simulated episode of locomotion, a sequence of velocity control instances (of a real navigation data instance) are applied to the simulated robot, with current simulated hardware parameters, to control the simulated robot during the simulated episode of locomotion. Simulated values for the simulated episode can be determined, that correspond to the ground truth values of the real data instance. For example, if the ground truth values are real robot poses after implementing the 10th, 20th, and 30th velocity control instances, simulated robot poses, of the simulated robot, can be determined after implementing the 10th, 20th, and 30th velocity control instances in the simulated episode of locomotion.

At least one loss can then be determined based on comparison of the ground truth values for the real navigation data instance, and the corresponding simulated values for the simulated episode. For example, where real robot and simulated robot poses are utilized, the loss can be based on the sum of all absolute differences between corresponding of the real poses and the simulated poses. As another example, where real robot and simulated robot poses are utilized, the loss can be based on an absolute difference between a corresponding real final pose and a simulated final pose. As yet another example, where real robot and simulated robot poses are utilized, the loss can be based on a difference between a subset of corresponding of the real poses and simulated poses. This loss can then be utilized to modify one or more of the current simulated hardware parameters, then the modified simulated hardware parameters utilized in performing, using the robotic simulator, a subsequent simulated episode of locomotion (that is based on another real navigation data instance). For example, VIZIER or another black-box optimizer can be utilized to determine, based on the loss, one or more new current simulated hardware parameters—and one or more of the current simulated hardware parameters modified by replacing the one or more current simulated hardware parameters with the one or more new current simulated hardware parameters. This can continue for a large quantity of iterations, until one or more conditions are satisfied. The one or more conditions can include a threshold quantity of iterations, convergence of simulated hardware parameter(s), and/or other condition(s). Through multiple iterations, the simulated hardware parameters are iteratively improved, in view of losses based on corresponding simulated values and ground truth values. Upon satisfaction of the one or more conditions, the most recently updated simulated hardware parameters can be considered optimal. Accordingly, utilizing such techniques results in optimized simulated hardware parameters that are more likely to result in simulated movement, of a simulated robot, that more closely corresponds to real world movement of a real robot—than did the initially utilized simulated hardware parameters. Thus, such optimized simulated hardware parameters mitigate the reality gap for the robotic simulator.

Each of the real navigation data instances may also optionally include environmental data. The environmental data for a given real navigation data instance defines one or more real environmental parameters, for the real environment, during the real episode of locomotion that corresponds to the given real navigation data instance. For example, the environmental data can define a topological parameter of a surface over which the locomotion is performed for a given real episode of locomotion. The topological parameter of the surface may represent one or more undulations of the surface (e.g., slopes in the real environment, hills in the real environment). As yet another example, the environmental data can additionally or alternatively define a surface friction coefficient of the surface over which the locomotion is performed for a given real episode of locomotion (e.g., the surface friction coefficient for wood, ice, metal, etc.). During a simulated episode of locomotion based on a real navigation data instance that includes environmental data, simulated environmental parameter(s) can be configured to those of the environmental data of the real navigation data instance. For example, a simulated topology can be configured based on a topological parameter of the environmental data. In some implementations, one or more simulated environmental parameters can additionally or alternatively be randomly selected and/or selected based on one or more learned distributions of the environmental parameters. Through variation of simulated environmental parameters, according to the above and/or other techniques, optimized simulated hardware parameters can be achieved that more accurately reflect actual parameters, as they are not unduly biased toward only a single fixed set of simulated environmental parameters.

In some implementations, a subset of simulated hardware parameters can be initially optimized utilizing techniques such as those described above. In some of those implementations, the subset is optimized utilizing first ground truth values (e.g., "real robot poses") for real navigation data instances, and corresponding simulated values. Further, in some version of those implementations, additional simulated hardware parameter(s) are then optimized utilizing techniques such as those described above, but utilizing second ground truth values (e.g., "real robot velocities"), and corresponding simulated values. The initially optimized subset can remain "fixed" during optimization of the additional simulated hardware parameter(s), or further optimized along with the additional simulated hardware parameter(s) (but utilizing the initially optimized values as "seeds"). Performing multiple optimizations utilizing different ground truth values can lead to improved optimization and/or quicker convergence for various simulated hardware parameters. For example, some hardware parameters can be more quickly and/or accurately optimized in view of losses generated based on first ground truth values, whereas other(s) can be more quickly and/or accurately optimized in view of losses generated based on second ground truth values. In some implementations, the environmental can additionally and/or alternatively be optimized using techniques disclosed herein.

In various implementations, the robotic simulator with optimized simulated hardware parameters is utilized to generate simulated training data used for training a machine learning model. The simulated training data is based on generated output from the robotic simulator (with the optimized simulated hardware parameters). One or more instances of the robotic simulator can be utilized to generate the simulated training data, and the instances can each execute on one or more computing devices. The machine learning model trained based on simulated training data can be, for example, used in controlling a real physical robot during performance of one or more tasks, such as robotic navigation and/or other task(s). The one or more machine learning models can optionally also be trained based on real training data generated based on output from one or more real physical robots. The training data may include training examples, having pairs training example input and corresponding training example output, and may also include, for example, a reward function for reinforcement learning. Additionally and/or alternatively, the robotic simulator with optimized simulated hardware parameters can be utilized for robot task regression testing and prototyping.

Notably, in various implementations, a lesser quantity of (or no) real training data can be utilized as a result of improved (e.g., more realistic) simulated training data that is generated by the robotic simulator. The simulated training data is improved as a result of the optimized simulated hardware parameters utilized by the robotic simulator being adapted according to techniques described herein. Utilizing a lesser quantity of (or no) real training data can reduce resources that would otherwise be consumed by real-world physical robots in generating a greater quantity of real training data, can cause less wear and tear to real-world physical robots as a result of generating a lesser quantity of (or no) real training data, can lead to an increase in time-efficiency in generating training data (e.g., simulated episodes can be performed in less clock on the wall time than real-world episodes), and/or can achieve additional and/or alternative benefits (e.g., more safe to use simulated robots compared to real robots, ground truth values may be labeled more easily). Moreover, use of the improved (e.g., more realistic) simulated training data in training one or more machine learning models leads to improved performance of task(s) (e.g., a higher success rate for the task(s)) by a real robot that utilizes the machine learning model(s) in performance of the task(s). In other words, bridging the reality gap according to various techniques disclosed herein can mitigate sim-to-real transfer problems and lead to improved performance of real robots that utilize machine learning model(s) trained according to techniques disclosed herein.

As used herein, the "reality gap" is a difference that exists between real robots and real environments—and simulated robots and simulated environments simulated by a robotic simulator. Implementations disclosed herein present various techniques for mitigating the reality gap for a robotic simulator and more particularly, for mitigating the reality gap through optimization of simulated hardware parameter(s) of simulated hardware components of a simulated robot.

The above description is provided as an overview of some implementations of the present disclosure. Further description of those implementations, and other implementations, are described in more detail below.

In some implementations, a method is provided that includes accessing a real navigation data instance stored in one or more computer-readable media. The real navigation data instance includes a sequence of velocity control instances generated to control a real robot during a real episode of locomotion of the real robot, and one or more ground truth values. Each of the ground truth values is a measured value of a corresponding property of the real robot at a corresponding point of the real episode of locomotion. The method further includes performing a simulated episode of locomotion using a robotic simulator with current simulated hardware parameters for one or more simulated hardware components of a simulated robot. Performing the simulated episode of locomotion includes applying the sequence of velocity control instances to the simulated robot, with the current simulated hardware parameters, to control the simulated robot during the simulated episode of locomotion. The method further includes identifying one or more simulated values that each correspond to a respective one of the ground truth values. Each of the simulated values is for the corresponding property of the simulated robot, and identifying the one or more simulated values is based on their occurrence being at corresponding points of the simulated episode of locomotion that correspond to the corresponding points of the real episode of locomotion. The method further includes generating at least one loss based on comparison of the one or more ground truth values to the one or more simulated values, modifying one or more of the current simulated hardware parameters based at least in part on the loss, and using the modified one or more of the current simulated hardware parameters in performing, using the robotic simulator, a subsequent simulated episode of locomotion.

These and other implementations of the technology may include one or more of the following features.

In some implementations, the one or more ground truth values may include a real pose of the real robot that occurred at a corresponding point of the real episode of locomotion. Further, the one or more simulated values may include a simulated pose of the simulated robot that is identified based on its occurrence being at a corresponding point of the simulated episode of locomotion that corresponds to the corresponding point of the real episode of locomotion. Even further, generating the at least one loss may be based on comparison of the real poses to the simulated poses. In some of those implementations, generating the at least one loss may be based on a difference between the real pose and the simulated pose.

In some implementations, the one or more ground truth values may include a plurality of real velocities of the real robot that each occurred at a corresponding point of the real episode of locomotion. Further, the one or more simulated values may include a plurality of simulated velocities of the simulated robot that are identified based on their occurrence being at corresponding points of the simulated episode of locomotion that correspond to the corresponding points of the real episode of locomotion. Even further, generating the at least one loss may be based on comparison of the real velocities to the simulated velocities.

In some implementations, the simulated hardware parameters for the one or more simulated hardware components of the simulated robot may include simulated wheel spinning friction of a wheel of the simulated robot, simulated wheel rolling friction of the wheel of the simulated robot, simulated wheel lateral friction of the wheel of the simulated robot, simulated wheel diameter of the simulated robot, simulated controller gain of a motor of the simulated robot, simulated base spinning friction of a base of the simulated robot, simulated base rolling friction of the base of the simulated robot, and/or simulated base lateral friction of the base of the simulated robot.

In some implementations, modifying one or more of the current simulated hardware parameters based at least in part on the loss may include utilizing a black-box optimizer to determine, based on the loss, one or more new current simulated hardware parameters, and modifying the one or more of the current simulated hardware parameters by replacing the one or more current simulated hardware parameters with the one or more new current simulated hardware parameters.

In some implementations, the real navigation data instance may further include environmental data that defines one or more real environmental parameters for a real environment in which the real episode of locomotion is performed. In some of those implementations, performing the simulated episode of locomotion using the robotic simulator may further include configuring a simulated environment based on the environmental data.

In some of those implementations, the one or more real environmental parameters for the real environment, defined by the environmental data, may include one or more topological parameters of a surface over which the locomotion is performed. In some implementations, configuring the simulated environment based on the environmental data may include configuring a simulated surface, of the simulated environment, based on the one or more topological parameters.

In some implementations, the method may further include selecting, from a superset of simulated environmental parameters for a particular simulated environmental property, a particular simulated environmental parameter for the particular simulated environmental property. In some implementations, performing the simulated episode of locomotion using the robotic simulator may further include configuring the simulated environment with the particular simulated environmental parameter.

In some of those implementations, selecting the particular simulated environmental parameter may include randomly selecting the one or more simulated environmental properties, or selecting the particular simulated environmental parameter based on a learned distribution of the superset of simulated environmental parameters. In some of those implementations, the particular environmental parameter may include a friction coefficient of a simulated surface of the simulated environment.

In some implementations, the method may further include generating the real navigation data instance. Generating the real navigation data instance may include obtaining the sequence of velocity control instances based on the sequence of velocity control instances being generated by the real robot during the real episode of locomotion of the real robot, generating the one or more ground truth values based on vision data obtained from a vision component of a motion capture system. The vision component may be external to the real robot, and the vision data captures the real robot during the real episode of the locomotion of the real robot. Generating the real navigation data instance may further include correlating the one or more ground truth values to the one or more corresponding points of the real episode of locomotion by assigning each of the one or more ground truth values to a corresponding one of the velocity control instances of the sequence of velocity control instances, the assigning may be based on vision data timestamps for the vision data used to generate the one or more ground truth values and velocity control instances timestamps of the sequence of velocity control instances.

In some of those implementations, the real episode of locomotion of the real robot may have a duration. In some of those implementations, the sequence of velocity control instances may be a continuous sequence for only a portion of the duration of the real episode of locomotion.

In some implementations, the method may further include performing one or more further iterations of modification of the one or more simulated hardware parameters. Performing the one or more further iterations of modification of the one or more simulated hardware parameters may be based on one or more additional losses, each generated based on performance of one or more additional simulated episodes of locomotion each based on a corresponding additional real navigation data instance. In some implementations, the method may further include determining that one or more conditions are satisfied after performing the one or more further iterations, and responsive to determining that the one or more conditions are satisfied, using the one or more simulated hardware parameters, as most recently modified by performing the one or more further iterations, in generating simulated training data for training of one or more machine learning models for use in control of at least one additional real robot.

In some of those implementations, using the one or more simulated hardware parameters, as most recently modified by performing the one or more further iterations, in generating the simulated training data for training of one or more machine learning models for use in control of at least one additional real robot may include performing, using the robotic simulator, new simulated navigation episodes that are not based on real navigation data instances, and generating the simulated training data based on the new simulated episodes.

In some of those implementations, the method may further include transmitting the simulated training data for training of the machine learning model based on the simulated training data. In some of those implementations, the method may further include training the machine learning model based on the simulated training data, and transmitting the trained machine learning model for use in control of the at least one additional robot.

In some implementations, a method is provided that includes optimizing a first group of one or more simulated hardware parameters for one or more simulated hardware components of a simulated robot. Optimizing the first group of the one or more simulated hardware parameters may include performing a plurality simulated episodes of locomotion by applying, in a robotic simulator, corresponding sequences of velocity control instances to the simulated robot, the corresponding sequences of velocity control instances generated during real episodes of real robot locomotion, generating losses based on comparing: simulated values, generated by the robotic simulator during performing the plurality of simulated episodes, to first ground truth values from the real episodes of real robot locomotion, wherein the first ground truth values are each a corresponding measured value for a first real robot property during the real episodes of real robot locomotion, and optimizing the first group of the one or more simulated hardware parameters based on the generated losses. The method further includes, subsequent to optimizing the first group of one or more simulated hardware parameters, optimizing a second group of one or more simulated hardware parameters for one or more simulated hardware components of a simulated robot. The second group of one or more simulated hardware parameters differs from the first group of one or more simulated hardware parameters. Optimizing the second group of the one or more simulated hardware parameters includes performing a plurality of additional simulated episodes of locomotion by applying, in the robotic simulator, corresponding additional sequences of velocity control instances to the simulated robot, the corresponding additional sequences of velocity control instances generated during the real episodes of real robot locomotion and/or during additional real episodes of real robot locomotion, generating additional losses based on comparing: additional simulated values, generated by the robotic simulator during performing the plurality of additional simulated episodes, to second ground truth values from the real episodes of real robot locomotion and/or the additional real episodes of real robot locomotion, wherein the second ground truth values are each a corresponding measured value for a second real robot property during the real episodes of real robot locomotion, and optimizing the second group of the one or more simulated hardware parameters based on the generated additional losses.

These and other implementations of the technology may include one or more of the following features.

In some implementations, the optimized first group of one or more simulated hardware parameters may be maintained as fixed during optimizing the second group of one or more simulated hardware parameters.

In some implementations, the optimized first group of one or more simulated hardware parameters may be further optimized, based on the generated additional losses, during optimizing the second group of one or more simulated hardware parameters.

In some implementations, the first ground truth values are pose values, and the second ground truth values are velocity values.

In some implementations, a method is provided that includes accessing a real navigation data instance stored in one or more computer-readable media. The real navigation data instance includes a sequence of velocity control instances generated to control a real robot during a real episode of locomotion of the real robot, one or more ground truth values, and environmental data that defines one or more real environmental parameters for a real environment in which the real episode of locomotion is performed. Each of the one or more ground truth values is a measured value of a corresponding property of the real robot at a corresponding point of the real episode of locomotion. The method further includes performing a simulated episode of locomotion using a robotic simulator with current simulated hardware parameters for one or more simulated hardware components of a simulated robot. Performing the simulated episode of locomotion using the robotic simulator includes configuring a simulated environment based on the environmental data, and applying the sequence of velocity control instances to the simulated robot, with the current simulated hardware parameters, to control the simulated robot during the simulated episode of locomotion. The method further includes identifying one or more simulated values that each correspond to a respective one of the ground truth values. Each of the simulated values is for the corresponding property of the simulated robot, and identifying the one or more simulated values is based on their occurrence being at corresponding points of the simulated episode of locomotion that correspond to the corresponding points of the real episode of locomotion. The method further includes generating at least one loss based on comparison of the one or more ground truth values to the one or more simulated values, modifying one or more of the current simulated environmental parameters based at least in part on the loss, and using the modified one or more of the current simulated environmental parameters in performing, using the robotic simulator, a subsequent simulated episode of locomotion.

Other implementations may include a non-transitory computer readable storage medium storing instructions executable by one or more processors (e.g., central processing unit(s) (CPU(s)), graphics processing unit(s) (GPU(s)), and/or tensor processing unit(s) (TPU(s))) to perform a method such as one or more of the methods described above and/or elsewhere herein. Yet other implementations may include a system of one or more computers and/or one or more robots that include one or more processors operable to execute stored instructions to perform a method such as one or more of the methods described above and/or elsewhere herein.

It should be appreciated that all combinations of the foregoing concepts and additional concepts described in greater detail herein are contemplated as being part of the subject matter disclosed herein. For example, all combinations of claimed subject matter appearing at the end of this disclosure are contemplated as being part of the subject matter disclosed herein.

DETAILED DESCRIPTION

Training of machine learning models that are robust and accurate, and that can be utilized for control of real-world physical robots, is often limited by the scalability of using real-world physical robots to generate a sufficient quantity of training data and/or to generate training data that is sufficiently diverse. For example, for many challenging navigation tasks, repeatedly running real robot experiments to collect real training data is infeasible in the real world. Implementations described herein present techniques for mitigating the reality gap between a robotic simulator, and real-world physical robot(s) and/or a real-world environment through optimization of one or more simulated hardware parameters for one or more simulated hardware components of a simulated robot. The robotic simulator with the optimized simulated hardware parameters can then be used in generating simulated training data. The simulated training data can be used in training of one or more machine learning models that can be used in the control of real-world physical robots. The simulated training data generated using the robotic simulator with the optimized simulated hardware parameters can be improved (e.g., more realistic) relative to simulated training data using a robotic simulator without simulated hardware parameters that have been optimized according to implementations described herein. This can enable training of a robust and/or accurate machine learning model using the simulated training data, while reducing a quantity of real-world training data that is also utilized in training the machine learning model—or even eliminating the need for use of real-world training data in training of the machine learning model.

Figure 1:
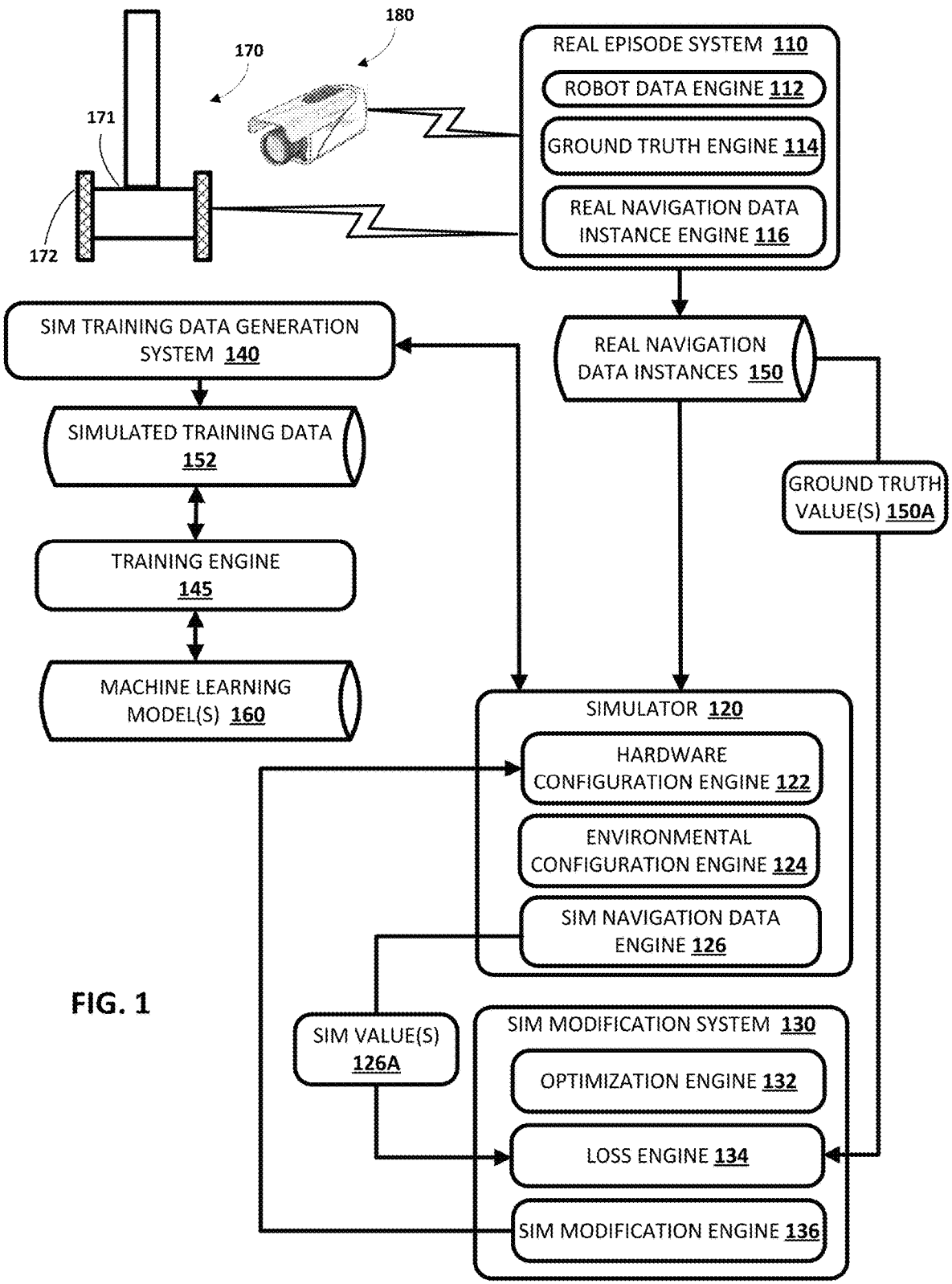
FIG. 1 illustrates an example environment in which implementations described herein can be implemented.

Turning now to the figures, FIG. 1 illustrates an example environment in which implementations described herein can be implemented. FIG. 1 includes an example robot 170, a motion capture system 180, a real episode system 110, a robotic simulator 120, a simulator (sim) modification system 130, a simulator (sim) training data generation system 140, and a training engine 145. Also included are real navigation data instances 150, simulated training data 152, and one or more machine learning models 160.

Robot 170 includes a base 171 with wheels 172 provided on opposite sides thereof for locomotion of the robot 170. The base 171 may include, for example, one or more motors for driving corresponding wheels 172 to achieve a desired direction, velocity, and/or acceleration of movement for the robot 170. The robot 170 can include a controller that translates higher level commands into more specific control commands to provide to one or more actuators of the robot 170 during a real episode of locomotion. The control commands can include one or more velocity control command(s) issued to actuator(s) of the robot 170 at a corresponding instance, to control movement of the robot 170 during the real episode of locomotion. For example, in controlling movement of the robot 170, velocity control commands can be issued to first and second actuators that control a respective one of first and second of the wheels 172. As described herein, such velocity control commands that are issued can be included in a real navigation data instance that is generated based on an episode of locomotion of the robot 170. Using the velocity control commands, instead of higher-level control commands, enables the velocity control instances to be utilized in simulation to remove any reality gap impacts that may be present in simulated controllers that would translate the higher level control commands to the velocity control instances.

In some implementations the robot 170 can also optionally include a localization module that utilizes data from one or more sensors of the robot 170 to estimate a pose of the robot at each of a plurality of points during a real episode of locomotion. For example, the localization module can estimate a current pose of the robot 170 based on odometers of the wheels 172, vision data from vision component(s) (e.g., a camera), an inertial measurement unit (IMU), and/or other sensor data. As described herein, localization information, from the localization module, can optionally be provided to the real episode system 110 and utilized by the ground truth engine 114 in generating ground truth values for real episodes of locomotion. Although a particular robot 170 having two wheels 172 is depicted in FIG. 1, alternative robots can be utilized in various implementations, such as robots having more or fewer wheels, a bipedal robot, a quadruped robot, an autonomous vehicle, and/or any other robot.

A real episode of locomotion performed by the robot 170 may include the robot traversing a corresponding trajectory. The trajectory traversed in a given real episode of locomotion can be based on a pre-defined or randomized (e.g., truly random, or "noise" inserted into a pre-defined path) path and can include traversal of the path at pre-defined or randomized velocities, accelerations, etc. Through multiple real episodes of locomotion, real episode data instances can capture data for a range of operating conditions for the robot 170. As one example, a real episode of locomotion may include providing instructions to the robot 170 to travel forward in a straight line at 2 m/s for a fixed duration, such as 5 seconds, or for a fixed distance, such as 10 meters. As another example, another real episode of locomotion may include providing instructions to the robot 170 to travel backwards in a straight line at 2 m/s for a fixed duration, such as 5 seconds, or for a fixed distance, such as 10 meters. As yet another example, another real episode of locomotion may include providing instructions to the robot 170 to travel forward in a straight line at 2 m/s for 5 seconds; turn right 90 degrees and travel forward in a straight line for another 5 seconds; then turn right 90 degrees and travel forward in a straight line for another 5 seconds; and then turn right 90 degrees and travel forward in a straight line for another five seconds, thus traversing a square. As yet another example, another real episode of locomotion can include providing instructions to the robot 170 to travel forward at a randomly selected velocity for a randomly selected amount of time between 3 and 7 seconds; turn right at a randomly selected value between 45 degrees and 135 degrees; then travel backwards with a fixed amount of acceleration for a randomly selected amount of time between 2 and 3 seconds; then turn left at a randomly selected value between 15 degrees and 90 degrees; and then travel forwards at 2 m/s for a randomly selected amount of time between 2 and 6 seconds. Although certain examples of trajectories are described, they are not meant to be limiting. Additional and/or alternative trajectories can be utilized and, in some implementations, can include multiple varied trajectories (e.g., varying in path, duration, velocities, accelerations, etc.) Through variations of real episodes of locomotion, robust data for the real navigation data instances is generated for optimizing value(s) of simulated hardware parameter(s).

For each real episode of locomotion, the sequence of control commands (e.g., velocity control instances) generated during the real episode of locomotion can be utilized by the real episode system 110 in generating one or more real navigation data instances. Further, one or more ground truth values for the real episode of locomotion can be generated by the real episode system 110 based on data from the robot 170, data from motion capture system 180, and/or data from human measurements. Generated ground truth value(s) can also be included in a real navigation data instance. Each of the ground truth values is for a corresponding point of the real episode of navigation and can be correlated to that point through assignment to a corresponding control command and/or to a corresponding timestamp of the real episode of navigation. For a given real episode of locomotion, one or multiple real navigation data instances can be generated. For example, a given real episode of locomotion can have a 10 second duration and a first real navigation data instance can be generated that includes velocity control instances for the entire duration, and corresponding ground truth value(s). Further, a second real navigation data instance can be generated that includes velocity control instances for only a first portion of the duration (e.g., from 2.5 seconds in, until 8.0 seconds in), and corresponding ground truth value(s). Yet further, a third real navigation data instance can be generated that includes only a second portion of the duration (e.g., from 5.0 seconds in, until the end), and corresponding ground truth value(s). Performing real episodes of locomotion using the real robot 170, and storing one or more real navigation data instances for each of the real episodes of locomotion is discussed in more detail herein (e.g., with respect to FIG. 2).

Motion capture system 180 is external to the robot 170 and includes a vision component (e.g., high-speed camera) to capture vision data (e.g., images). The vision component of the motion capture system 180 has a field of view of at least a portion of the real environment of the robot 170. The vision component can be attached at a fixed location in the environment, but can optionally be adjustable. For example, the pose (e.g., pan and/or tilt) of the motion capture system 180 can be adjusted and/or a field of view, capture rate, and/or other properties of the motion capture system 180 can be adjusted. The vision component of the motion capture system 180 can be, for example, a monographic camera (e.g., generating 2D RGB images), a stereographic camera (e.g., generating 2.5D RGBD images), and/or a laser scanner (e.g., generating a 2.5D "point clouds"), and/or high-speed cameras (e.g., generating 2D RGB images of reflective markers), and can be operatively connected to one or more systems (e.g., the real episode system 110) disclosed herein.

Vision data can be captured by one or more vision components of motion capture system 180 during a real episode of locomotion. The vision data can be processed by the motion capture system 180, and/or the real episode data system 110 to generate one or more ground truth values for the real episode of locomotion. The ground truth value(s) generated based on such data can include ground truth pose(s) of the real robot 170 (e.g., including position and orientation components), ground truth velocities of the real robot 170, and/or other ground truth values that are each a measured property of the robot 170 at a corresponding point in time. Optionally, one or more markers may be placed along the environment (e.g., a grid overlaid on the surface) and/or may be placed on the robot 170 (e.g., passive markers, active markers, and/or reflective markers), and utilized in generating ground truth values based on the vision data captured by the vision component(s) of motion capture system 180. For example, a grid overlaid on the surface can be utilized in generating ground truth pose value(s) based on portion(s) of the grid being captured in corresponding vision data. Optionally, a clock of the motion capture system 180 can be synced with a clock of the real robot 170 to enable assignment of generated ground truth value(s) to corresponding points of a real episode of locomotion. For example, a given ground truth pose can be assigned to a corresponding time and/or velocity control instance of a real navigation data instance based on the given ground truth pose being generated based on vision data having a timestamp that matches the corresponding time and/or a timestamp of the corresponding velocity control instance.

Additionally and/or alternatively, human measurements may be taken and may be provided to the real episode system 110 and utilized as ground truth values. For example, during a real episode of locomotion, a tape measure and compass can be used to determine a pose of the robot 170 relative to a reference frame in the real environment.

Robot 170 and/or other robots can be utilized to perform real episodes of locomotion, and data associated with the real episodes of locomotion can be utilized by the real episode system 110 to generate real navigation data instances 150. The real navigation data instances 150 can be stored by the real episode system 110 in one or more computer-readable media (e.g., one or more databases). In some implementations, all or aspects of real episode system 110 can be implemented on robot 170 (e.g., via one or more processors of robot 170). In some implementations, all or aspects of real episode system 110 can be implemented on one or more computing devices that are separate from, but in network communication with, robot 170.

A sequence of velocity control instances (or other control commands) generated by the robot 170 during a real episode of locomotion are provided to the robot data engine 112 of real episode system 110. The robot data engine 112 can also optionally receive, or generate, environmental data that defines one or more environmental parameters for the real episode of locomotion. For example, the robot data engine 112 can optionally generate environmental data that defines a surface friction coefficient of a surface traversed during the real episode and/or or one or more topological parameters of the surface traversed during the real episode. The robot data engine 112 can generate the environmental data based on human provided, sensed, and/or otherwise determined environmental parameters. For example, the robot data engine 112 can generate particular environmental data for a real episode of locomotion based on data indicating that real episode of locomotion was performed in an environment having a surface with a particular friction coefficient and/or with a particular topology.

The ground truth engine 114 of real episode system 110 receives and/or generates one or more ground truth values for the real episode of locomotion. As described herein, the ground truth values can be generated based on, for example, localization information from the robot 170, the vision data captured by the motion capture system 180, and/or hand measurements. The ground truth values may include one or more poses of the robot at a particular time instance, one or more velocity values at a particular time instance, one or more acceleration values at a particular time instance, or any other data or value indicating objective data. It is noted that, in various implementations, the ground truth engine 114 can generate and store multiple types of ground truth values for a single real episode of locomotion. For example, one or more ground truth pose values and one or more ground truth velocity values can be stored for a single real episode of locomotion. Further, it is noted that, in various implementations, the ground truth engine 114 can generate a first quantity of ground truth values generated and stored for a real episode of locomotion, where the first quantity is less than a second quantity of velocity control instances (stored by the robot data engine 112) for the real episode of locomotion. For example, there can be a sequence of 500 velocity control instances for a real episode of locomotion, and all 500 velocity control instances can be stored. However, there can be less than 500 ground truth values generated and stored. For instance, there can be only 5, 10, or other quantity of ground truth values generated and stored.

The real navigation data instance engine 116 generates a real navigation data instance based on a continuous sequence of at least a portion of the velocity control instances from the robot data engine 112, and based on ground truth value(s), from the ground truth engine 114, that correspond to those velocity control instances. The real navigation data instance engine 116 can correlate velocity control instances (or other control commands) and ground truth values based on, for example, corresponding timestamps of the velocity control instances and the ground truth values. For example, the real navigation data instance engine 116 can correlate a ground truth value to a velocity control instance (or a corresponding time) based on a timestamp for the first ground truth value being most proximal to a timestamp for the velocity control instance (or the corresponding time). As described herein (e.g., with respect to FIG. 2), in various implementations the real navigation data instance engine generates multiple real navigation data instances based on a single real episode of locomotion.

The simulator 120 is a robotic simulator implemented by one or more computer systems and is used to simulate various environments that include corresponding environmental objects, to simulate a robot operating in the simulated environment (e.g., to simulate robot 170), to simulate responses of the robot in response to virtual implementation of various simulated robotic actions, and to simulate interactions between the simulated robot and the simulated environmental objects in response to the simulated robotic actions. Various simulators can be utilized, such as physics engines that simulates collision detection, soft and rigid body dynamics, etc. One non-limiting example of such a simulator is the BULLET physics engine.

The simulator 120 includes a hardware configuration engine 122 and an environmental configuration engine 124. The hardware configuration engine 122 dictates one or more simulated hardware parameters of the simulated robot during a simulation. In some implementations, simulated hardware parameters can be randomly selected and/or selected based on one or more learned distributions of the simulated hardware parameters. Simulated hardware parameters can include, for example, simulated wheel spinning friction of a wheel of the simulated robot, simulated wheel rolling friction of the wheel of the simulated robot, simulated wheel lateral friction of the wheel of the simulated robot, simulated wheel diameter of the simulated robot, simulated controller gain of a motor of the simulated robot, simulated base spinning friction of a base of the simulated robot, simulated base rolling friction of the base of the simulated robot, simulated base lateral friction of the base of the simulated robot, and/or other simulated hardware parameters. The environmental configuration engine 124 dictates one or more parameters of the simulated environment during a simulation. The one or more parameters of the simulated environment can include, for example, topological characteristics of the simulated environment, coefficient(s) of friction of surface(s) of the simulated environment, properties of simulated environmental object(s), and/or other simulated environmental parameter(s). As described in more detail herein, the current hardware parameters dictated by the hardware configuration engine 122 during a given simulated episode can be adapted based on feedback from the simulator modification system 130, which causes the hardware configuration engine 122 to iteratively adapt one or more current hardware parameters based on optimizations of the current hardware parameters as described herein. Additionally, and/or alternatively, the current environmental parameters dictated by the environmental configuration engine 124 during a given episode of locomotion can also be adapted based on feedback from the simulator modification system 130, which causes the environmental configuration engine 124 to iteratively adapt one or more current environmental parameters based on optimizations of the current environmental parameters as described herein.

In adapting the simulated hardware parameters and/or simulated environmental parameters utilized by the simulator 120, a simulated navigation data engine 126 of the simulator 120 is utilized to perform simulated episodes of locomotion that are each based on a corresponding one of the real navigation data instances 150 generated by the real episode system 110. In performing each such simulated episode, the simulated navigation data engine 126 retrieves one of the real navigation data instances 150 from the computer readable medium/media in which it is stored. If the retrieved real navigation data instance includes environmental data, the simulated navigation data engine 126 can configure a simulated environment based on such environmental data. Otherwise, default environmental parameters can be utilized, randomly selected environmental parameters can be utilized, or environmental parameters selected based on a learned distribution can be utilized.

The simulated navigation data engine 126 then causes a simulated episode of navigation to be performed by causing the velocity control instances (or other commands) of the real navigation data instance to be implemented by the simulated robot in the simulated environment. The simulated navigation data engine 126 determines simulated value(s) 126A for the simulated episode, where each of the simulated value(s) 126A corresponds to one of the ground truth value(s) 150A of the real navigation data instance.

A loss engine 134 of the simulator modification system 130 determines one or more losses based on the simulated value(s) 126A generated by the simulated navigation data engine 126 for the simulated episode of navigation that is based on a real navigation data instance, and based on the corresponding ground truth value(s) 150A stored in association with that real navigation data instance. For example, assume a simulated episode of locomotion is performed based on a first real navigation data instance and the ground truth values 150A for the first real navigation data instance define a first real pose of the robot 170 at a first point (e.g., after a corresponding velocity control instance) and define a second real pose of the robot 170 at a second point (e.g., after a corresponding velocity control instance). Further assume a first simulated value is determined that is a first simulated pose of the simulated robot at the first point of the simulated episode and a second simulated value is determined that is a second simulated pose of the simulated robot at the second point of the simulated episode. The loss engine 134 can determine a loss based on comparison of the first and second real poses to the first and second simulated poses. For example, the loss engine 134 can determine the loss as the sum of: the absolute difference between the first real pose and the first simulated pose; and the absolute difference between the second real pose and the second simulated pose (e.g., using an L1 loss function). Additional and/or alternative loss functions can be utilized. In some implementations, different loss functions will be utilized for different types of ground truth/simulated values, and/or for different simulated hardware parameter(s) that are being optimized.

The optimization engine 132 utilizes the loss generated by the loss engine 134 (optionally, in batch techniques, in combination with other loss(es) from other simulated episode(s)) to optimize one or more of the current simulated hardware parameters. For example, the optimization engine 132 may utilize a black-box optimizer, such as VIZIER, to determine one or more new current simulated hardware parameters—and one or more of the current simulated hardware parameters modified by the simulation modification engine 136 to replace the one or more current simulated hardware parameters with the one or more new current simulated hardware parameters. The simulation modification engine 136 of the simulator modification system 130 may provide the updated hardware parameters to the hardware configuration engine 122 such that the updated hardware parameters are used in subsequent simulated episode(s) of locomotion. This can continue for a large quantity of iterations, until one or more conditions are satisfied. The one or more conditions can include a threshold quantity of iterations, convergence of simulated hardware parameter(s), and/or other condition(s). Through multiple iterations, the simulated hardware parameters are iteratively improved, in view of losses based on corresponding simulated values and ground truth values. Upon satisfaction of the one or more conditions, the most recently updated simulated hardware parameters can be considered optimal. Accordingly, utilizing such techniques results in optimized simulated hardware parameters that are more likely to result in simulated movement, of a simulated robot, that more closely corresponds to real world movement of a real robot—than did the initially utilized simulated hardware parameters.

Additionally, and/or alternatively, the optimization engine 132 utilizes the loss generated by the loss engine 134 (optionally, in batch techniques, in combination with other loss(es) from other simulated episode(s)) to optimize one or more of the current simulated environmental parameters. For example, the optimization engine 132 may utilize a black-box optimizer, such as VIZIER, to determine one or more new current simulated environmental parameters—and one or more of the current simulated environmental parameters modified by the simulation modification engine 136 to replace the one or more current simulated environmental parameters with the one or more new current simulated environmental parameters. The simulation modification engine 136 of the simulator modification system 130 may provide the updated environmental parameters to the environmental configuration engine 124 such that the updated environmental parameters are used in subsequent simulated episode(s) of locomotion.

In some implementations, a subset of simulated hardware parameters can be initially optimized utilizing techniques such as those described above. In some of those implementations, the subset is optimized utilizing first ground truth values (e.g., "real robot poses") for real navigation data instances, and corresponding simulated values. Further, in some version of those implementations, additional simulated hardware parameter(s) are then optimized utilizing techniques such as those described above, but utilizing second ground truth values (e.g., "real robot velocities"), and corresponding simulated values. In other versions of those implementations, the additional simulated hardware parameter(s) are then optimized utilizing techniques such as those described above, but utilizing the first ground truth values utilized in optimizing the initial subset of the simulated hardware parameters. The initially optimized subset can remain "fixed" during optimization of the additional simulated hardware parameter(s), or further optimized along with the additional simulated hardware parameter(s) (but utilizing the initially optimized values as "seeds"). Performing multiple optimizations utilizing different ground truth values, and utilizing various subsets of the simulated hardware parameters, can lead to improved optimization and/or quicker convergence for various simulated hardware parameters. For example, some hardware parameters can be more quickly and/or accurately optimized in view of losses generated based on first ground truth values, whereas other(s) can be more quickly and/or accurately optimized in view of losses generated based on second ground truth values. This type of optimization is described in more detail herein (e.g., with respect to FIG. 3)

When the simulated hardware parameters are considered to be optimal (e.g., condition(s) satisfied), the simulator 120 can then be utilized to perform new simulated episodes, and those new simulated episodes utilized by the simulator training data generation system 140 in generating simulated training data 152. The new simulated episodes performed by the simulator 120 can be episodes of locomotion. One or more (e.g. all) of the new simulated episodes can control the simulated robot without reference to the episode data instances 150. In this manner, the new simulated episodes can generate simulated data that is based on simulated robot trajectories and/or simulated environmental object configurations that vary from trajectories and/or object configurations of episode data instances. The simulated environment and/or simulated robot control during one or more (e.g., all) of the new simulated episodes can be random, pseudo-random, and/or dictated by one or more policies.

Figure 5:
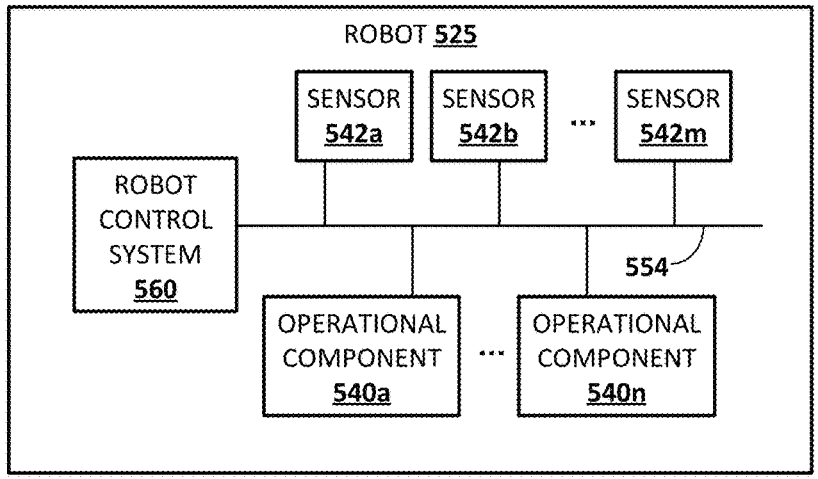
FIG. 5 schematically depicts an example architecture of a robot.

The simulator training data generation system 140 utilizes simulated training data generated by the simulator 120 to generate simulated training data 152 (e.g. as described in FIG. 5). The simulated training data 152 can be based on simulated training data from one or more time steps of a new simulated navigation episode. Such data can include, for example, simulated data that indicates a sequence of simulated velocity control instances, simulated data that indicates pose(s) for the simulated robot at one or more time steps of the simulated episode, a sequence of acceleration instances, etc.

The training engine 145 utilizes the simulated training data 152 to train one or more machine learning models 160. For example, the training engine 145 can process simulated training data to generate simulated training example input and simulated training example output, process the simulated training example input of the simulated training example using one of the machine learning model(s) 160, generate a predicted output based on the processing, compare the predicted output to the simulated training example output of the simulated training example, and update the machine learning model based on the comparison. For instance, determine an error based on the comparison and update the machine learning model by backpropagating the error over all or portions of the machine learning model. As another example, the training engine can utilize the simulated training data in training of one or more machine learning models using reinforcement learning. The training engine 145 can also optionally train one or more of the machine learning model(s) 160 utilizing one or more real training examples that are based on real navigation data instances (and/or environmental data) of a real robot during performance of episodes of locomotion by the real robot. Such real episodes can include those utilized to generate the real navigation data instances 150 and/or other episodes.

Figure 2:
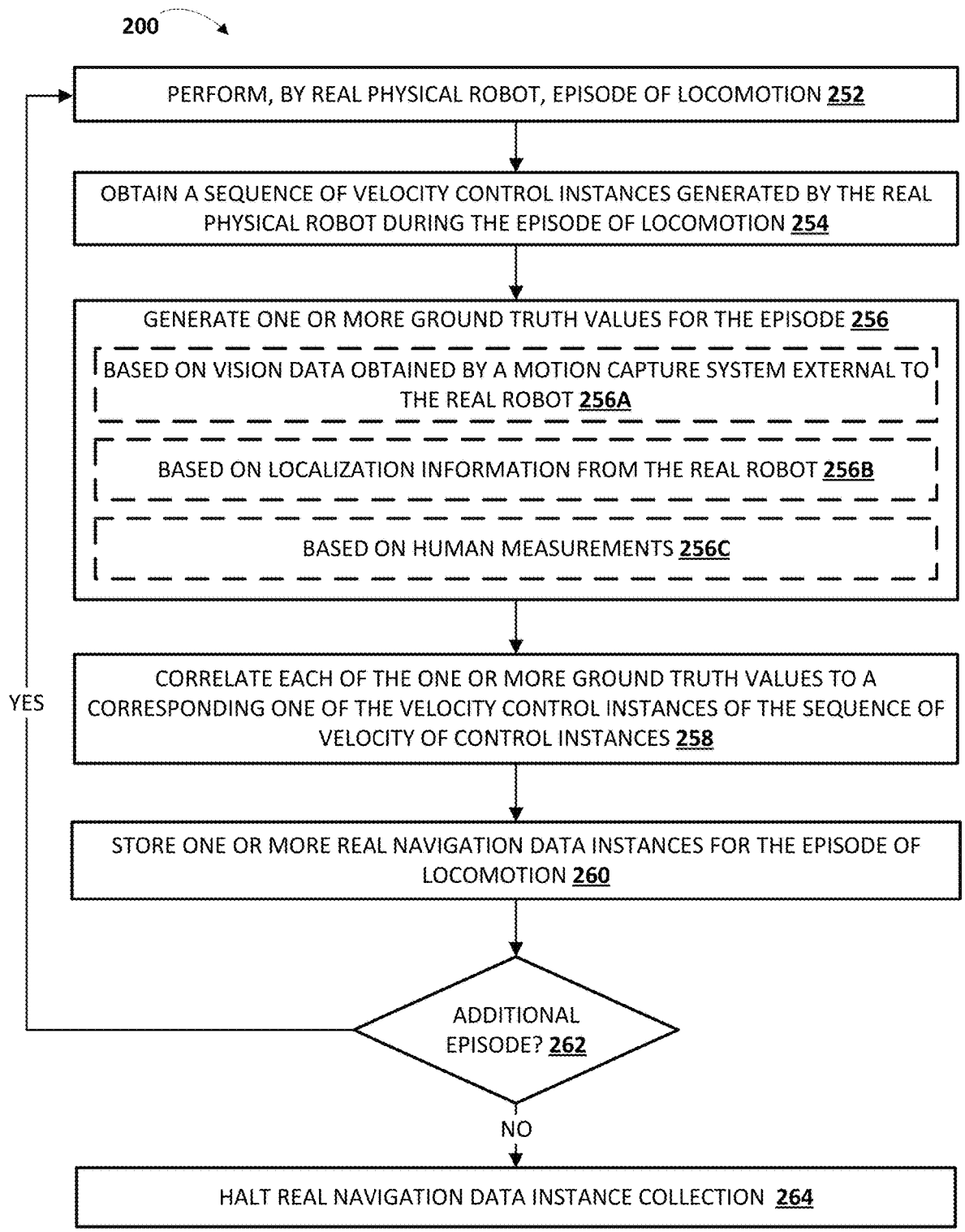
FIG. 2 is a flowchart illustrating an example method of performing real episodes of locomotion using a real robot, and storing one or more real navigation data instances for each of the real episodes of locomotion according to implementations disclosed herein.

Although the aspects disclosed hereinabove with respect to FIG. 1, and the aspects disclosed hereinbelow with respect to FIG. 2, are described with respect to a single real robot performing real episodes of locomotion, and a single robotic simulator performing simulated episodes of locomotion, that is not meant to be limiting. Multiple real robots may perform real episodes of locomotion (optionally in parallel) and multiple robot simulators may simultaneously perform simulated episodes of locomotion (and optionally share updates to simulated hardware parameters). However, for the sake of brevity, implementations disclosed herein often refer to a single real robot and a single robotic simulator.

Turning now to FIG. 2, an example method 200 is illustrated of performing real episodes of locomotion using a real robot, and storing one or more real navigation data instances for each of the real episodes of locomotion. For convenience, some of the operations of the method 200 are described with reference to a system that performs the operations. This system may include various components of various computer systems and/or robots, such as one or more components depicted in FIG. 1. Moreover, while operations of the method 200 are shown in a particular order, this is not meant to be limiting. One or more operations may be reordered, omitted or added.

At block 252, a real physical robot performs an episode of locomotion. For example, a real robot may traverse a trajectory, such as traversing a straight line at 2 m/s for 5 seconds. Additional or alternative trajectories can be traversed during an episode of locomotion, and the trajectory traversed during an episode of locomotion can optionally be varied at one or more (e.g., each) iterations of block 252.

At block 254, the system obtains a sequence of velocity control instances generated by the real robot during the episode of locomotion. The sequence of velocity control instances can include all of the velocity control instances provided during the episode of locomotion, and a quantity of the velocity control instances can be dependent, for example, on a control frequency of the real robot. For example, if 20 velocity control instances are generated every second during the episode of locomotion, and the episode is 7 seconds in duration, then a sequence of 140 velocity control instances can be obtained for the episode.

At block 256, the system generates one or more ground truth values for the episode of locomotion utilizing one or more techniques. Three non-limiting examples of such techniques are described in sub-blocks 256A-C. At sub-block 256A, the system generates one or more of the ground truth values for the episode based on vision data obtained by a motion capture system external to the robot. For example, vision data can be processed to determine ground truth values that are each a corresponding pose of the real robot at a corresponding point of the episode. As another example, vision data can be processed to determine ground truth values that are each a corresponding velocity of the real robot at a corresponding point of the episode. At sub-block 256B, the system generates one or more of the ground truth values for the episode based on localization information and/or other data from the real robot. For example, localization information from the robot can include poses for the robot, and one or more of the poses can be utilized as ground truth values. At sub-block 256C, the system generates one or more of the ground truth values for the episode based on human measurements (e.g., ground truth robot pose(s) determined using a tape measure and compass). In some implementations, one or more ground truth values can each be determined based on a combination of the techniques described in sub-blocks 256A-C and/or other technique(s). For example, a ground truth robot pose value for a given point can be based on an average, or other combination, of: a first robot pose value determined based on motion capture vision data; and a second robot pose value determined based on localization information from the real robot. In some implementations, ground truth value(s) of a first type and ground truth value(s) of a second type can be determined at block 256. For example, ground truth robot poses can be determined for a plurality of points of the episode, and ground truth robot velocities can also be determined (for the same points and/or for different points).

At block 258, the system correlates each of the one or more ground truth values to a corresponding one of the velocity control instances of the sequence of velocity control instances. For example, the system can use timestamps to correlate ground truth robot poses to corresponding velocity control instances.

At block 260, the system stores one or more real navigation data instances for the episode of locomotion. In some implementations, each real episode of locomotion is utilized to generate multiple real navigation data instances, each covering a unique portion of the real episode of locomotion. As one example, a first real navigation data instance can be generated based on a real episode of locomotion and can include velocity control instances from the beginning of the real episode of locomotion (i.e., robot starting at t=0 seconds from a rest position) to the end of the real episode of locomotion (i.e., robot has come to a rest position after performing the real episode of locomotion), along with one or more corresponding ground truth values. Further, a second real navigation data instance can be generated based on the same real episode of locomotion, and include instances from the beginning of the real episode of locomotion only half-way through the real episode of locomotion, along with one or more corresponding ground truth values. Yet further, a third real navigation data instance can be generated based on the same real episode of locomotion, and include instances from one-third of the way through the real episode of locomotion to two-thirds of the way through the real episode, along with one or more corresponding ground truth values. In these and other manners, a plurality of real navigation data instances may be derived from a single real episode of locomotion.

At block 262, the system determines whether an additional episode of locomotion is to be performed by the real robot and/or another real robot. If, at an iteration of block 262, the system determines another episode of locomotion has been performed, then the method returns to block 252 to perform an additional episode of locomotion. The further iteration of block 252 can utilize the same robot or another real robot and perform the same or a different real episode of locomotion. If, at an iteration of block 262, the system determines another episode of locomotion is not to be performed, then the method may proceed to block 264 and halts real navigation data instance collection.

Figure 3:
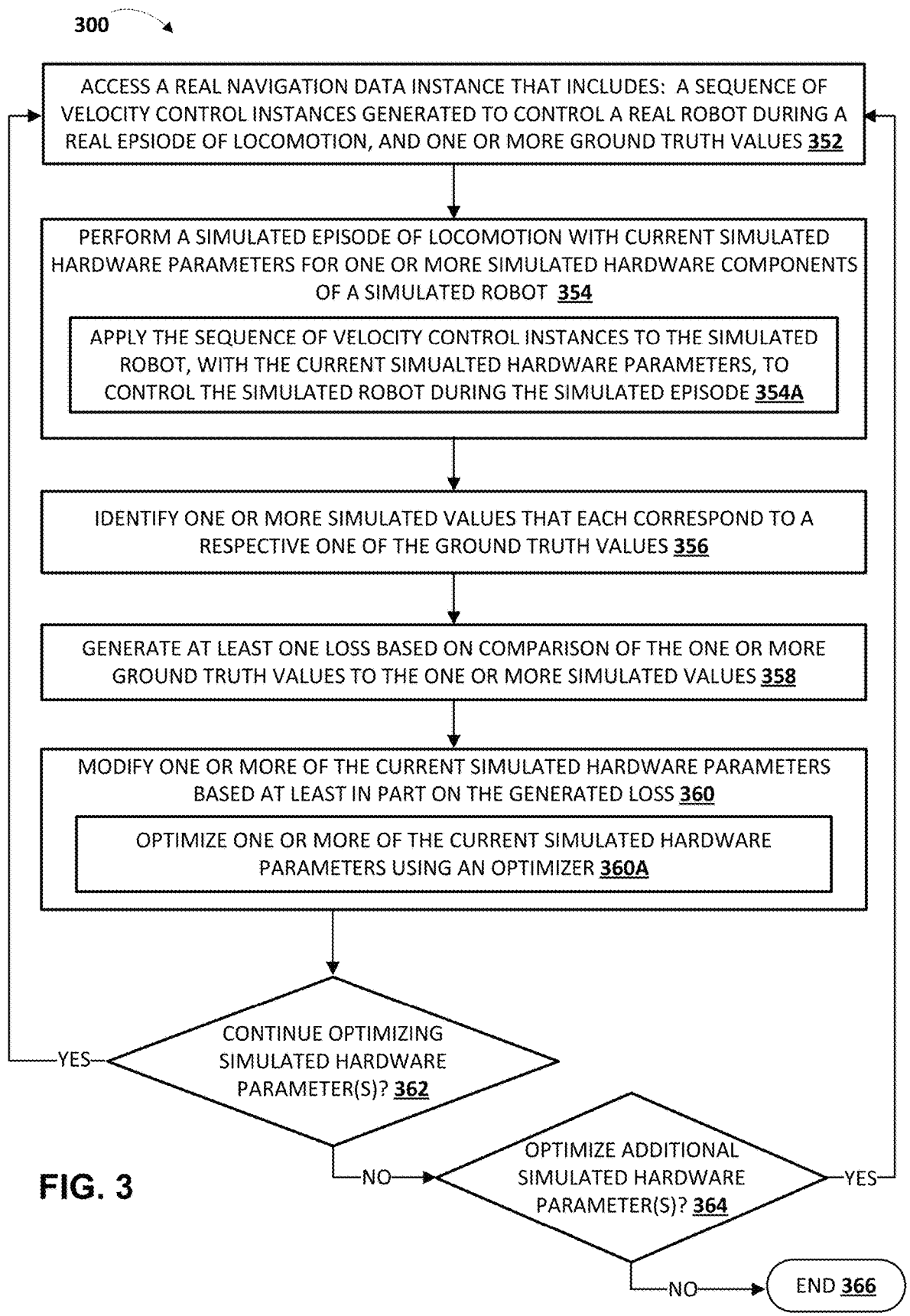
FIG. 3 is a flowchart illustrating an example method of performing simulated episodes of locomotion with simulated hardware parameters utilizing real navigation data instances, and modifying one or more of the simulated hardware parameters according to implementations disclosed herein.

Turning now to FIG. 3, an example method 300 is illustrated of performing simulated episodes of locomotion with simulated hardware parameters utilizing real navigation data instances, and modifying one or more of the simulated hardware parameters according to implementations disclosed herein. For convenience, the operations of the method 300 are described with reference to a system that performs the operations. This system may include various components of various computer systems, such as one or more components depicted in FIG. 1. Moreover, while operations of the method 300 are shown in a particular order, this is not meant to be limiting. One or more operations may be reordered, omitted or added.

At block 352, the system accesses a real navigation data instance that includes: a sequence of velocity control instances generated to control a real robot during a real episode of locomotion, and one or more ground truth values. For example, the system may access a real navigation data instance, such as a given one of the real navigation data instances stored in real navigation data instances 150 of FIG. 1 and/or generated based on method 200 of FIG. 2. In some implementations, the sequence of velocity commands are low-level commands sent to actuator(s) of a real robot during a corresponding real episode of locomotion, such as actuator(s) that drive wheel(s) of the real robot. In some implementations, the one or more ground truth values each correspond to a corresponding measured value of a corresponding property of the real robot at a corresponding point of the real episode of locomotion, such as a 2D, 3D, or 6D robot pose at the corresponding point, a robot velocity at the corresponding point, etc. One or more of the ground truth values can be generated based on data determined during the real episode of locomotion, such as vision data from a motion capture system, localization information from the real robot, and/or human measurements (e.g., described herein with respect to FIG. 1).

At block 354, the system performs a simulated episode of locomotion with current simulated hardware parameters for one or more simulated hardware components of a simulated robot. For example, the system may perform the simulated episode of locomotion using the simulator 120 of FIG. 1. The operations of block 354 include sub-block 354A, where the system applies the sequence of velocity control instances (of the real navigation data instance of block 352) to the simulated robot, with the current simulated hardware parameters, to control the simulated robot during the simulated episode of locomotion. For example, the simulated robot of the simulator 120 of FIG. 1 may perform a simulated episode of locomotion by applying, to the simulated robot, the sequence of velocity control instances that were applied to actuator(s) of the real robot, to cause the simulated robot to undergo simulated locomotion.

At block 356, the system identifies one or more simulated values that each correspond to a respective one of the ground truth values. The system may identify one or more of the simulated values that each correspond to a respective one of the ground truth values based on their occurrence being at corresponding points of the simulated episode of locomotion that correspond to corresponding points of the real episode of locomotion. For example, if the respective ground truth values are a first robot pose at a first point (e.g., a point in time and/or a point relative to velocity control instance(s)) and a second robot pose at a second point, then the system may identify simulated values that are a first simulated pose of the simulated robot at the first point and second simulated pose of the simulated robot at the second point. As another example, if the respective ground truth values are a first robot velocity (i.e., the overall velocity of the robot, not the velocity control instance) of the real robot at the first point and a second robot velocity of the real robot at the second point, then the system may identify simulated values that are a simulated robot velocity of the simulated robot at the first point and a simulated robot velocity of the simulated robot at the second point.

At block 358, the system generates at least one loss based on comparison of the one or more ground truth values to the one or more simulated values. For example, the at least one loss can include a loss that is based on the sum of all absolute differences between ground truth values that are real robot poses and simulated values that are simulated robot poses (e.g., an L1 loss). The at least one loss can additionally or alternatively include another loss that is based on the differences between ground truth values that are real robot velocities and simulated values that are simulated robot velocities. Various additional and/or alternative loss functions can be utilized.

At block 360, the system modifies one or more of the current simulated hardware parameters based at least in part on the at least one loss generated at block 358. In some implementations, block 360 occurs after every iteration of block 358. In some other implementations, the modification of block 360 is based on a batch of losses and block 360 occurs after a plurality of iterations of block 358 (and a corresponding plurality of iterations of blocks 352, 354, and 356), utilizing all losses from those plurality of iterations.

As described in more detail herein, in some implementations initial iterations of block 360 (i.e., those that occur before a "yes" determination at block 364, described below) can include modifying only a first subset of simulated hardware parameters, later iterations (i.e., those that occur after a first "yes" determination at block 364) can include modifying a second subset of the simulated hardware parameters (while keeping the first subset fixed, or continuing to optimize those), and optionally further later iterations (i.e., those that occur after further "yes" determination(s) at block 364) can include modifying further subset(s) of the simulated hardware parameters. For example, the first subset can include only simulated wheel spinning friction; the second subset can include only simulated proportional gain, simulated derivative gain, and simulated integral gain of a simulated motor of the simulated robot; etc. Moreover, the modifications of the different subsets can optionally be based on losses (generated at block 358) that are generated based on different loss function(s) and/or different type(s) of ground truth values and simulated values. Accordingly, in those implementations, initial iterations of method 300 can optimize a first subset of simulated hardware parameters (optionally utilizing a first loss function and/or first type(s) of ground truth/simulated values), next iterations of method 300 can optimize a second subset of simulated hardware parameters (optionally utilizing a second loss function and/or second type(s) of ground truth/simulated values), etc. This can enable quicker convergence of optimized simulated hardware parameters, than if all simulated hardware parameters were optimized simultaneously. This can additionally or alternatively enable utilization of different loss functions and/or ground truth/simulated values for the different optimizations, where they are chosen to enable quicker and/or more accurate optimization of corresponding simulated hardware parameters.

Block 360 can include sub-block 360A, where the system modifies one or more of the current hardware parameters by optimizing one or more of the simulated hardware parameters using an optimizer. For example, VIZIER or another black-box optimizer can be utilized to determine, based on the at least one generated loss (and the current simulated hardware parameters), one or more new current simulated hardware parameters—and one or more of the current simulated hardware parameters modified by replacing the one or more current simulated hardware parameters with the one or more new current simulated hardware parameters. For example, based on the at least one loss generated at block 358, a new simulated proportional gain of a motor of the simulated robot may be 0.5. The new simulated proportional gain of the motor of the simulated robot may then supplant the current simulated proportional gain of the motor of the simulated robot of 0.3.

At block 362, the system determines whether to continue optimizing the simulated hardware parameters. If, at an iteration of block 362, the system determines to continue optimizing the simulated hardware parameters, then the system returns to block 352 and accesses an additional real data navigation instance. The system can determine whether to continue optimizing the subset of the newly modified simulated hardware parameters based on whether one or more conditions have been satisfied. The one or more conditions can include a threshold quantity of iterations, convergence of the simulated hardware parameter(s), and/or other condition(s). Through multiple iterations, the simulated hardware parameters are iteratively improved, in view of losses based on corresponding simulated values and ground truth values.

If, at an iteration of block 362, the system determines to halt optimization of the simulated hardware parameters, then the system can proceed to optional block 364.

At block 364, the system determines whether to optimize an additional subset of simulated hardware parameters. It is noted that block 364 can be omitted in implementations that optimize all simulated hardware parameters simultaneously. If, at an iteration of block 364, the system determines to optimize an additional subset of the simulated hardware parameters, then the system returns to block 352 to access an additional real navigation data instance. The system can determine to optimize an additional subset of the simulated hardware parameters, if there is a remaining subset that has not yet been optimized.

In optimizing the additional subset of the simulated hardware parameters, subsequent iterations of blocks 352-364 can be tailored to the additional subset being optimized. For example, different types of ground truth and simulated values can be utilized, a different loss function can be utilized, and the additional subset will be modified. For instance, in performing additional iterations of blocks 352, the system may access different types of ground truth values (or different types of real navigation data instances having different ground truth values) for use in an alternate loss function at iterations of block 358. Also, for instance, at block 356 the system can identify different types of ground truth values for use in an alternate loss function at iterations of block 358.

As another example, in some implementations of block 360, during subsequent optimization of the additional subset of the simulated hardware parameters, any previously optimized simulated hardware parameters may remain "fixed" during optimization of the additional subset of the simulated hardware parameters. In other implementations of block 360, during subsequent optimization of the additional subset of the simulated hardware parameters, any previously optimized simulated hardware parameters may be further optimized along with the additional subset (but utilizing the initially optimized values as "seeds").

If, at an iteration of block 364, the system determines not to optimize an additional subset of the simulated hardware parameters, then the system proceeds to block 366 and the method 300 ends.

Figure 4:
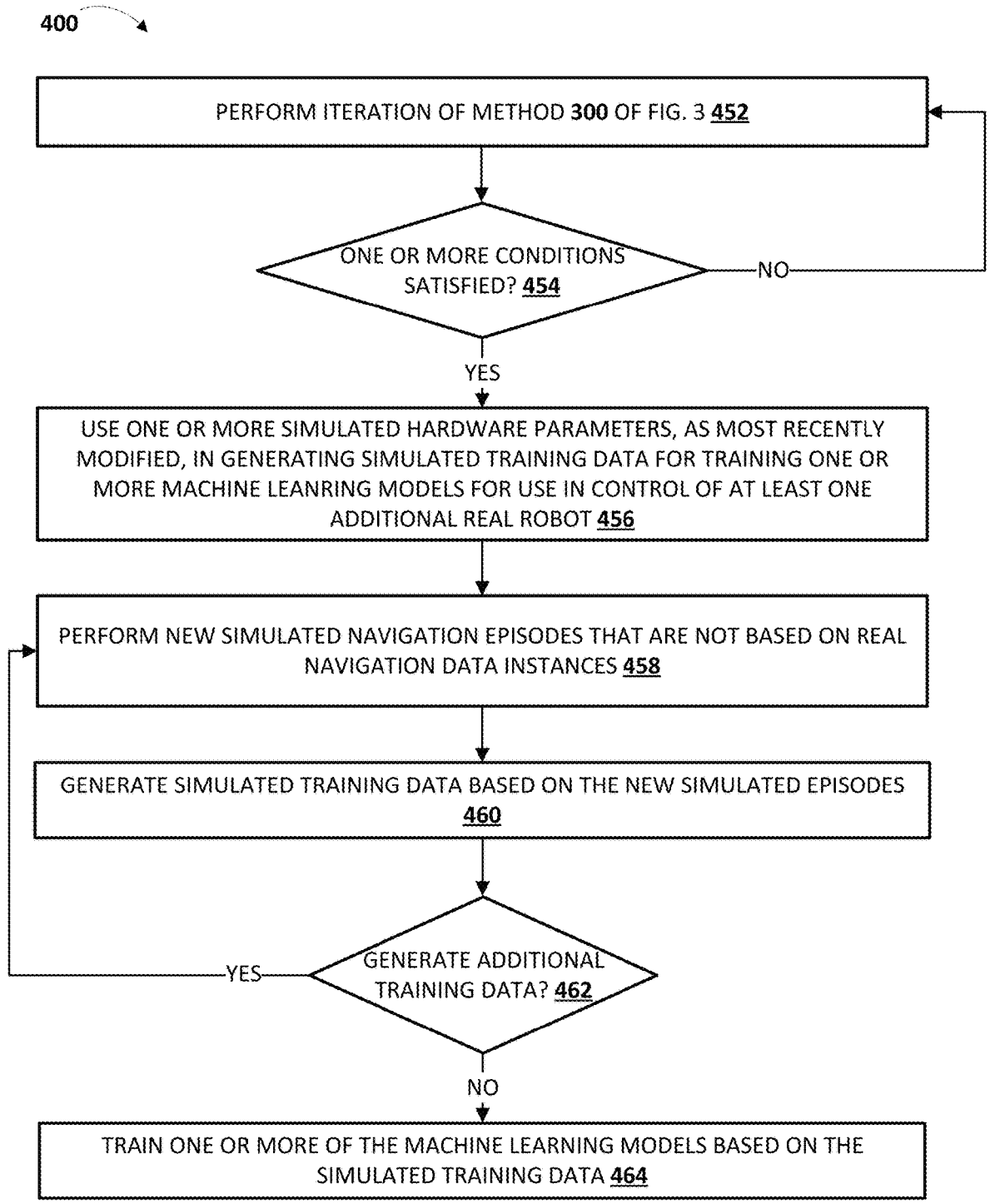
FIG. 4 is a flowchart illustrating an example method of generating training data by performing simulated navigation episodes according to implementations disclosed herein.

FIG. 4 is a flowchart illustrating an example method 400 of generating training data by performing simulated navigation episodes according to implementations disclosed herein. For convenience, the operations of the method 400 are described with reference to a system that performs the operations. This system may include various components of various computer systems, such as one or more components depicted in FIG. 1. Moreover, while operations of the method 400 are shown in a particular order, this is not meant to be limiting. One or more operations may be reordered, omitted or added.

At block 452, the system performs an iteration of method 300 of FIG. 3. At block 454, the system determines whether one or more conditions are satisfied. The one or more conditions can include a threshold quantity of iterations, convergence of simulated hardware parameter(s), and/or other condition(s). Through multiple iterations of method 300, the simulated hardware parameters are iteratively improved, in view of losses based on corresponding simulated values and ground truth values. If, at an iteration of block 454, the system determines one or more of the conditions are not satisfied, then the method returns to block 452 to perform another iteration of method 300 of FIG. 3. This can continue for a large quantity of iterations, until one or more of the conditions are satisfied. If, at an iteration of block 454, the system determines one or more of the conditions are satisfied, then the method can proceed to block 456.

At block 456, the system uses one or more simulated hardware parameters, as most recently modified, in generating simulated training data for training one or more machine learning models for use in control of at least one additional real robot. For example, the system can utilize a simulated robot with the most recently modified simulated hardware parameters, such as an optimized simulated wheel spinning friction of a wheel of the simulated robot and/or an optimized simulated base rolling friction of a base of the simulated robot, in subsequent simulated episodes of locomotion. By using the optimized simulated hardware parameters to generate simulated training data, more accurate simulated training data is obtained as compared to using non-optimized hardware parameters to generate simulated training data.

At block 458, the system performs new simulated navigation episodes that are not based on real navigation data instances. For example, the system may perform the new simulated navigation episodes using the newly modified simulated hardware parameters that satisfy one or more of the conditions at block 454. At block 460, the system generates simulated training data based on the new simulated episodes. During the new simulated navigation episodes, data, such as one or more simulated sequences of velocity commands and/or one or more simulated poses for the simulated robot, can be generated, stored, and used as training data for training a machine learning model for use in control of at least one additional real robot. By generating simulated training data, the need for performing real episodes of locomotion to generate training data is reduced and/or obviated.

At block 462, the system determines whether to generate additional simulated training data. For example, the system may determine not to generate additional training data based on a threshold quantity of training data being generated by the system, generating training data for a threshold quantity of time, generating training data for a threshold number of new simulated episodes of locomotion, etc. If, at an iteration of block 462, the system determines to generate additional simulated training data, then the method returns to block 458 to perform new simulated navigation episodes that are not based on real navigation data instances. If, at an iteration of block 462, the system determines not to generate additional simulated training data, then the method may proceed to block 464. At block 464, the system may train one or more machine learning models based on the generated simulated training data.

FIG. 5 schematically depicts an example architecture of a robot 525. The robot 525 includes a robot control system 560, one or more operational components 540a-540n, and one or more sensors 542a-542m. The sensors 542a-542m may include, for example, vision components, light sensors, pressure sensors, pressure wave sensors (e.g., microphones), proximity sensors, accelerometers, gyroscopes, thermometers, barometers, and so forth. While sensors 542a-542m are depicted as being integral with robot 525, this is not meant to be limiting. In some implementations, sensors 542a-542m may be located external to robot 525, e.g., as standalone units.

Operational components 540a-540n may include, for example, one or more end effectors and/or one or more servo motors or other actuators to effectuate movement of one or more components of the robot. For example, the robot 525 may have multiple degrees of freedom and each of the actuators may control actuation of the robot 525 within one or more of the degrees of freedom responsive to the control commands. As used herein, the term actuator encompasses a mechanical or electrical device that creates motion (e.g., a motor), in addition to any driver(s) that may be associated with the actuator and that translate received control commands into one or more signals for driving the actuator. Accordingly, providing a control command to an actuator may comprise providing the control command to a driver that translates the control command into appropriate signals for driving an electrical or mechanical device to create desired motion.

The robot control system 560 may be implemented in one or more processors, such as a CPU, GPU, and/or other controller(s) of the robot 525. In some implementations, the robot 525 may comprise a "brain box" that may include all or aspects of the control system 560. For example, the brain box may provide real time bursts of data to the operational components 540a-540n, with each of the real time bursts comprising a set of one or more control commands that dictate, inter alia, the parameters of motion (if any) for each of one or more of the operational components 540a-540n. In some implementations, the robot control system 560 may perform one or more aspects of one or more methods described herein.

As described herein, in some implementations all or aspects of the control commands generated by control system 560 can be generated based on a machine learning model that is trained, in whole or in part, based on simulated training data generated according to techniques described herein. Although control system 560 is illustrated in FIG. 5 as an integral part of the robot 525, in some implementations, all or aspects of the control system 560 may be implemented in a component that is separate from, but in communication with, robot 525. For example, all or aspects of control system 560 may be implemented on one or more computing devices that are in wired and/or wireless communication with the robot 525, such as computing device 610.

Figure 6:
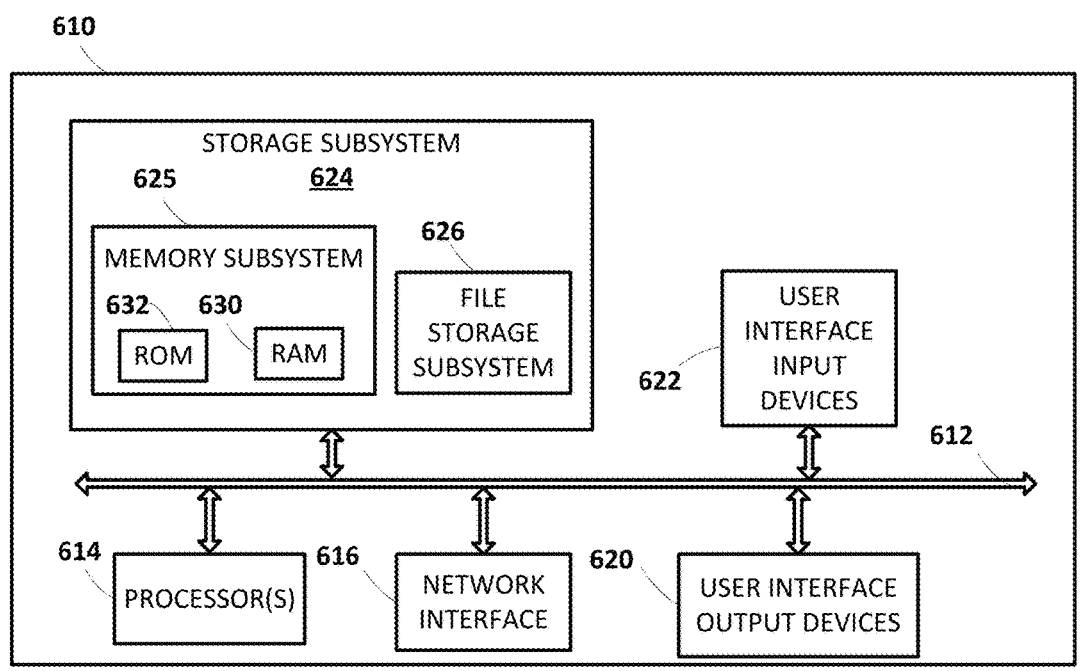
FIG. 6 schematically depicts an example architecture of a computer system.

FIG. 6 is a block diagram of an example computing device 610 that may optionally be utilized to perform one or more aspects of techniques described herein. For example, in some implementations computing device 610 may be utilized to execute simulator 120, simulator modification system 130, real episode system 110, simulator training data system 140, and/or training engine 145. Computing device 610 typically includes at least one processor 614 which communicates with a number of peripheral devices via bus subsystem 612. These peripheral devices may include a storage subsystem 624, including, for example, a memory subsystem 625 and a file storage subsystem 626, user interface output devices 620, user interface input devices 622, and a network interface subsystem 616. The input and output devices allow user interaction with computing device 610. Network interface subsystem 616 provides an interface to outside networks and is coupled to corresponding interface devices in other computing devices.

User interface input devices 622 may include a keyboard, pointing devices such as a mouse, trackball, touchpad, or graphics tablet, a scanner, a touchscreen incorporated into the display, audio input devices such as voice recognition systems, microphones, and/or other types of input devices. In general, use of the term "input device" is intended to include all possible types of devices and ways to input information into computing device 610 or onto a communication network.

User interface output devices 620 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computing device 610 to the user or to another machine or computing device.

Storage subsystem 624 stores programming and data constructs that provide the functionality of some or all of the modules described herein. For example, the storage subsystem 624 may include the logic to perform selected aspects of one or more methods described herein.

These software modules are generally executed by processor 614 alone or in combination with other processors. Memory 625 used in the storage subsystem 624 can include a number of memories including a main random access memory (RAM) 630 for storage of instructions and data during program execution and a read only memory (ROM) 632 in which fixed instructions are stored. A file storage subsystem 626 can provide persistent storage for program and data files, and may include a hard disk drive, a floppy disk drive along with associated removable media, a CD-ROM drive, an optical drive, or removable media cartridges. The modules implementing the functionality of certain implementations may be stored by file storage subsystem 626 in the storage subsystem 624, or in other machines accessible by the processor(s) 614.

Bus subsystem 612 provides a mechanism for letting the various components and subsystems of computing device 610 communicate with each other as intended. Although bus subsystem 612 is shown schematically as a single bus, alternative implementations of the bus subsystem may use multiple busses.

Computing device 610 can be of varying types including a workstation, server, computing cluster, blade server, server farm, or any other data processing system or computing device. Due to the ever-changing nature of computers and networks, the description of computing device 610 depicted in FIG. 6 is intended only as a specific example for purposes of illustrating some implementations. Many other configurations of computing device 610 are possible having more or fewer components than the computing device depicted in FIG. 6.

What is claimed is:

1. A method implemented by one or more processors, the method comprising:
    accessing a real navigation data instance stored in one or more computer-readable media, wherein the real navigation data instance comprises:
        a sequence of velocity control instances generated to control a real robot during a real episode of locomotion of the real robot,
        one or more ground truth values, wherein each of the ground truth values is a measured value of a corresponding property of the real robot at a corresponding point of the real episode of locomotion, and
        environmental data that defines one or more real environmental parameters for a real environment in which the real episode of locomotion is performed;
    performing a simulated episode of locomotion using a robotic simulator with simulated hardware parameters for one or more simulated hardware components of a simulated robot, wherein performing the simulated episode of locomotion comprises:
        configuring current simulated environmental parameters, of a simulated environment of the robotic simulator, based on the environmental data, and
        applying the sequence of velocity control instances to the simulated robot, with the simulated hardware parameters, to control the simulated robot during the simulated episode of locomotion;
    identifying one or more simulated values that each correspond to a respective one of the ground truth values, wherein each of the simulated values is for the corresponding property of the simulated robot, and wherein identifying the one or more simulated values is based on their occurrence being at corresponding points of the simulated episode of locomotion that correspond to the corresponding points of the real episode of locomotion;
    generating at least one loss based on comparison of the one or more ground truth values to the one or more simulated values;
    modifying one or more of the current simulated environmental parameters based at least in part on the loss; and
    using the modified one or more of the current simulated environmental parameters in performing, using the robotic simulator, a subsequent simulated episode of locomotion.

2. The method of claim 1,
    wherein the one or more ground truth values comprise a real pose of the real robot that occurred at a corresponding point of the real episode of locomotion,
    wherein the one or more simulated values comprise a simulated pose of the simulated robot that is identified based on its occurrence being at a corresponding point of the simulated episode of locomotion that corresponds to the corresponding point of the real episode of locomotion; and
    wherein generating the at least one loss is based on comparison of the real pose to the simulated pose.

3. The method of claim 2, wherein generating the at least one loss is based on a difference between the real pose and the simulated pose.

4. The method of claim 1, wherein the one or more ground truth values comprise a plurality of real velocities of the real robot that each occurred at a corresponding point of the real episode of locomotion,
    wherein the one or more simulated values comprise a plurality of simulated velocities of the simulated robot that are identified based on their occurrence being at corresponding points of the simulated episode of locomotion that correspond to the corresponding points of the real episode of locomotion; and
    wherein generating the at least one loss is based on comparison of the real velocities to the simulated velocities.

5. The method of claim 1, wherein modifying one or more of the current simulated environmental parameters based at least in part on the loss comprises:
    utilizing a black-box optimizer to determine, based on the loss, one or more new current simulated environmental parameters; and
    modifying the one or more of the current simulated environmental parameters by replacing the one or more current simulated environmental parameters with the one or more new current simulated environmental parameters.

6. The method of claim 1, wherein the one or more simulated environmental parameters comprise one or more topological parameters of a surface over which the locomotion is performed.

7. The method of claim 1, wherein the one or more simulated environmental parameters comprise a friction coefficient of a simulated surface of the simulated environment.

8. The method of claim 1, further comprising:
generating the real navigation data instance, generating the real navigation data instance comprising:
obtaining the sequence of velocity control instances based on the sequence of velocity control instances being generated by the real robot during the real episode of locomotion of the real robot;
generating the one or more ground truth values based on vision data obtained from a vision component of a motion capture system, wherein the vision component is external to the real robot and wherein the vision data captures the real robot during the real episode of locomotion of the real robot; and
correlating the one or more ground truth values to the one or more corresponding points of the real episode of locomotion by assigning each of the one or more ground truth values to a corresponding one of the velocity control instances of the sequence of velocity control instances, the assigning being based on vision data timestamps for the vision data used to generate the one or more ground truth values and velocity control instances timestamps of the sequence of velocity control instances.

9. The method of claim 8, wherein the real episode of locomotion of the real robot has a duration, and wherein the sequence of velocity control instances are a continuous sequence for only a portion of the duration of the real episode of locomotion.

10. The method of claim 1, further comprising:
performing one or more further iterations of modification of the one or more simulated environmental parameters, wherein performing the one or more further iterations of modification of the one or more simulated environmental parameters is based on one or more additional losses, each generated based on performance of one or more additional simulated episodes of locomotion, each based on a corresponding additional real navigation data instance;
determining that one or more conditions are satisfied after performing the one or more further iterations; and
responsive to determining that the one or more conditions are satisfied:
using the one or more simulated environmental parameters, as most recently modified by performing the one or more further iterations, in generating simulated training data for training of one or more machine learning models for use in control of at least one additional real robot.

11. The method of claim 10, wherein using the one or more simulated environmental parameters, as most recently modified by performing the one or more further iterations, in generating the simulated training data for training of one or more machine learning models for use in control of at least one additional real robot comprises:
performing, using the robotic simulator, new simulated navigation episodes that are not based on real navigation data instances; and
generating the simulated training data based on the new simulated episodes.

12. The method of claim 11, further comprising:
transmitting the simulated training data for training of the machine learning model based on the simulated training data.

13. The method of claim 11, further comprising:
training the machine learning model based on the simulated training data; and
transmitting the trained machine learning model for use in control of the at least one additional robot.

14. A method implemented by one or more processors, the method comprising:
optimizing a first group of one or more simulated environmental parameters for one or more simulated environmental parameters of a simulated environment of a robotic simulator, wherein optimizing the first group of the one or more simulated environmental parameters comprises:
performing a plurality simulated episodes of locomotion by applying, in the robotic simulator, corresponding sequences of velocity control instances to a simulated robot operating in the simulated environment, the corresponding sequences of velocity control instances generated during real episodes of real robot locomotion;
generating losses based on comparing:
simulated values, generated by the robotic simulator during performing the plurality of simulated episodes, to
first ground truth values from the real episodes of real robot locomotion, wherein the first ground truth values are each a corresponding measured value for a first real robot property during the real episodes of real robot locomotion; and
optimizing the first group of the one or more simulated environmental parameters based on the generated losses;
subsequent to optimizing the first group of one or more simulated environmental parameters:
optimizing a second group of one or more simulated environmental parameters for one or more simulated environmental parameters of a simulated environment of a robotic simulator, wherein the second group of one or more simulated environmental parameters differs from the first group of one or more simulated environmental parameters, and wherein optimizing the second group of the one or more simulated environmental parameters comprises:
performing a plurality of additional simulated episodes of locomotion by applying, in the robotic simulator, corresponding additional sequences of velocity control instances to the simulated robot operating in the simulated environment, the corresponding additional sequences of velocity control instances generated during the real episodes of real robot locomotion and/or during additional real episodes of real robot locomotion;
generating additional losses based on comparing:
additional simulated values, generated by the robotic simulator during performing the plurality of additional simulated episodes, to
second ground truth values from the real episodes of real robot locomotion and/or the additional real episodes of real robot locomotion, wherein the second ground truth values are each a corresponding measured value for a second real robot property during the real episodes of real robot locomotion; and
optimizing the second group of the one or more simulated environmental parameters based on the generated additional losses.

15. The method of claim 14, wherein the optimized first group of one or more simulated environmental parameters are maintained as fixed during optimizing the second group of one or more simulated environmental parameters.

16. The method of claim 14, wherein the optimized first group of one or more simulated environmental parameters are further optimized, based on the generated additional losses, during optimizing the second group of one or more simulated environmental parameters.

17. The method of claim 14, wherein the first ground truth values are pose values, and the second ground truth values are velocity values.

18. A system, comprising:
memory storing instructions;
one or more processors configured to execute the instructions to:
access a real navigation data instance, wherein the real navigation data instance comprises:
a sequence of velocity control instances generated to control a real robot during a real episode of locomotion of the real robot,
one or more ground truth values, wherein each of the ground truth values is a measured value of a corresponding property of the real robot at a corresponding point of the real episode of locomotion, and
environmental data that defines one or more real environmental parameters for a real environment in which the real episode of locomotion is performed;
perform a simulated episode of locomotion using a robotic simulator, wherein in performing the simulated episode of locomotion one or more of the processors are to:
configure current simulated environmental parameters, of a simulated environment of the robotic simulator, based on the environmental data, and
apply the sequence of velocity control instances to a simulated robot, of the robotic simulator, to control the simulated robot during the simulated episode of locomotion;
identify one or more simulated values that each correspond to a respective one of the ground truth values, wherein each of the simulated values is for the corresponding property of the simulated robot, and wherein identifying the one or more simulated values is based on their occurrence being at corresponding points of the simulated episode of locomotion that correspond to the corresponding points of the real episode of locomotion;
generate at least one loss based on comparison of the one or more ground truth values to the one or more simulated values;
modify one or more of the current simulated environmental parameters based at least in part on the loss; and
use the modified one or more of the current simulated environmental parameters in performing, using the robotic simulator, a subsequent simulated episode of locomotion.

* * * * *